US006952136B2

(12) United States Patent
Gupta

(10) Patent No.: US 6,952,136 B2
(45) Date of Patent: Oct. 4, 2005

(54) SYSTEM TO REDUCE UNWANTED OSCILLATIONS IN HIGH SPEED, HIGH GAIN OR TRANSIMPEDANCE AMPLIFIERS

(75) Inventor: Sandeep K. Gupta, Aliso Viejo, CA (US)

(73) Assignee: Broadcom Corporation, Irvine, CA (US)

( * ) Notice: Subject to any disclaimer, the term of this patent is extended or adjusted under 35 U.S.C. 154(b) by 163 days.

(21) Appl. No.: 10/229,175

(22) Filed: Aug. 28, 2002

(65) Prior Publication Data

US 2004/0041633 A1 Mar. 4, 2004

(51) Int. Cl.$^7$ ................................ H03F 3/08
(52) U.S. Cl. .................... 330/308; 250/214 A; 330/297
(58) Field of Search ............... 330/59, 98, 133, 330/297, 308, 310; 250/214 A, 214 AG

(56) References Cited

U.S. PATENT DOCUMENTS

| | | | |
|---|---|---|---|
| 6,249,621 B1 | 6/2001 | Sargent, IV et al. | .......... 385/24 |
| 6,492,872 B1 * | 12/2002 | Fujioka et al. | .............. 330/285 |
| 6,566,954 B2 * | 5/2003 | Miyazawa | .................. 330/285 |
| 6,639,473 B1 * | 10/2003 | Kobayashi | .................. 330/308 |
| 6,856,201 B2 | 2/2005 | Gupta | ........................ 330/308 |

FOREIGN PATENT DOCUMENTS

EP 0 525 807 A2 A3 2/1993 ........... H04B/10/14

OTHER PUBLICATIONS

Yoon, T. and Jalali, B., "Front–End CMOS Chipset for Fiber–Based Gigabit Ethernet,"*Symposium on VLSI Circuits Digest of Technical Papers*, IEEE, 1998, pp. 188–191.
Lee, W.S. et al., "Monolithic Integration of an InP/InGaAs Four–Channel Transimpedance Optical Receiver Array,"*Electronic Letters*, IEE, vol. 26, No. 22, Oct. 25, 1990, pp. 1833–1834.
Copy of European Search Report for Appln. No. EP 03 01 9369, mailed Dec. 11, 2003, 3 pages.

* cited by examiner

*Primary Examiner*—Khanh Van Nguyen
(74) *Attorney, Agent, or Firm*—Sterne, Kessler, Goldstein & Fox P.L.L.C.

(57) ABSTRACT

A system reduces unwanted oscillations in a multiple gigabit per second, high gain amplifier portion. The system includes a power source portion having a plurality of power sources and a bias current portion having a plurality of bias current devices. The system also includes an amplification portion having a plurality of amplifiers. A first group of the plurality of amplifiers is coupled to the power source portion and the bias current portion, such that feedback voltage is substantially eliminated to substantially eliminate oscillations in the amplification portion.

30 Claims, 7 Drawing Sheets

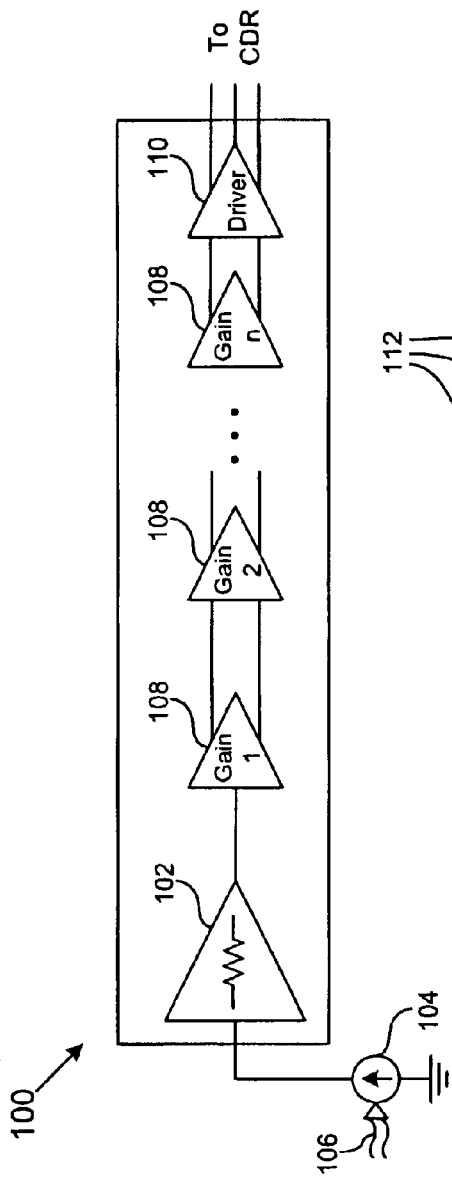
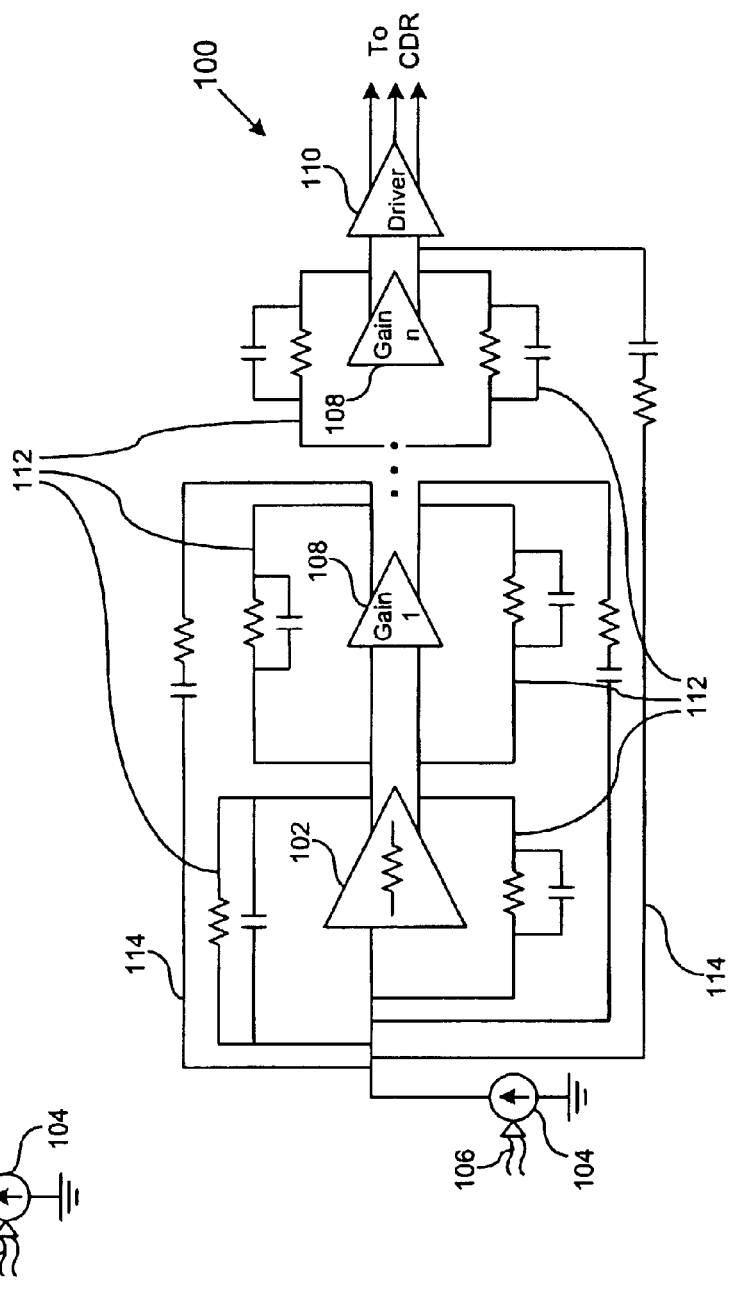
FIG. 1A
FIG. 1B

SYSTEM TO REDUCE UNWANTED OSCILLATIONS IN HIGH SPEED, HIGH GAIN OR TRANSIMPEDANCE AMPLIFIERS

BACKGROUND OF THE INVENTION

1. Field of the Invention

The present invention relates to a system that reduces unwanted oscillations in high speed (e.g., 10 GHz baud rates), high gain or high transimpedance amplifiers that are located in integrated circuits (ICs).

2. Background Art

Transimpedance amplifiers (TIAs) and limiting amplifiers (LAs) are used in optical receivers as front end stages to convert photodetector signal currents to voltage output, which is then fed to a clock and data recovery (CDR) circuit. For high speed (e.g., implementation at 10 GHz baud rate) designs, getting high values of gains and transimpedance (e.g., about 45 dB of transimpedance, about 60 dB of gain, so net transimpedance of about 105 dB) at these signal frequencies in a single integrated circuit chip exposes the chip to phenomenal risk of unwanted oscillations through several parasitic mechanisms.

Therefore, what is needed is an amplifier portion on an IC chip that substantially reduces all parasitic feedback coupling paths, thus substantially reduces all unwanted oscillations. This will reduce adverse effects on the input signal caused by the unwanted oscillations, such that the input signal is not drowned out by voltage along the coupling feedback paths.

BRIEF SUMMARY OF THE INVENTION

Embodiments of the present invention provide a system including a power source portion including a plurality of power sources and a bias current portion including a plurality of bias current devices coupled to respective individual ones of the power sources. The system also includes an amplification portion including a plurality of amplifiers, a first group of the plurality of amplifiers being coupled to the power source portion and the bias current portion such that feedback voltage is substantially eliminated to substantially eliminate oscillations in the amplification portion.

Other embodiments of the present invention provide a system for reducing unwanted oscillations in a multiple gigabit per second, high gain amplifier portion. The system includes power sources, bias current devices, and the amplifier portion. The amplification portion includes a transimpedance amplifier, gain amplifiers, and a driving device.

In further embodiments, no active nodes are coupled to an entire substrate that includes Domains. The substrate is tied to ground through external, dedicated pins. Each Domain layout can include an insulation ring isolating one Domain from all the other Domains. Therefore, the substrate is only coupled to external, dedicated pins and nothing else. This essentially eliminates parasitic feed back paths from any element in one Domain to any element in all the other Domains in the system.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIG. 1A is a schematic diagram of a convention system that amplifies an input signal.

FIG. 1B is a schematic diagram of a parasitic feedback paths in the conventional system of FIG. 1A.

Figure 1C:
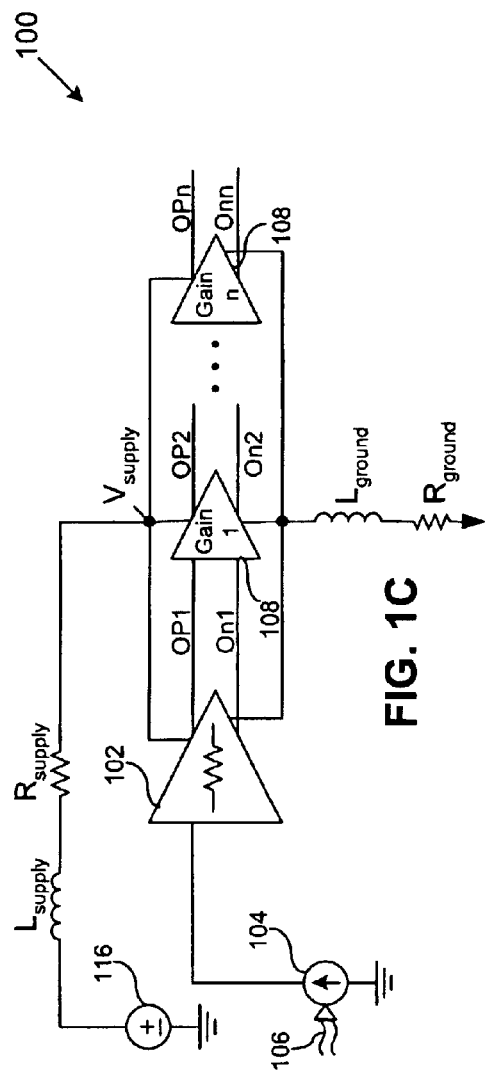
FIG. 1C is a schematic diagram of a power supply configuration for the conventional system in FIG. 1A.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

FIG. 1A is a schematic diagram of a conventional implementation of a system 100 having high gain, high speed TIA or LA stages. An input signal to a transimpedance stage 102 is single ended, primarily due to the use of a single photodetector 104 to gather an optical input 106. A single ended signal provides very little noise immunity for transimpedance stage 102 because transimpedance stage 102 is directly coupled to a power supply (FIG. 1C). Following transimpedance stage 102 are a predetermined number of gain stages 108 and driver stage 110. The gain stages 108 have better noise immunity because of their differential output, which is to the first order.

FIG. 1B shows example intrinsic parasitic feedback paths 112 (e.g., that are connected across a single gain stage 108) and feedback paths 114 (e.g., that feedback from all gain stages 108 to an input of transimpedance stage 102) formed between elements of system 100. Circuits used to implement gain stages 108 are conventionally placed on a single, physical silicon substrate (not shown) or chip. Unwanted parasitic paths 112, 114 exist from each gain stage output node back to the input of that and all previous gain stages 108 and transimpedance stage 102, respectively. As can be seen in FIG. 1B, each parasitic path 112, 114 consists of a resistor-capacitor (RC) circuit. For high gain implementations, the input signal amplitude increases as it is routed through the chain of gain stages 108. As one example, each gain stage 108 can increase the input signal from photo detector 104 three to four times, so by a second gain stage 108 a factor of 16. Any coupled mechanisms from theses nodes that have high signal swing back to the inputs can produce unwanted oscillations. Oscillations build up at a frequency provided such feedback paths can have a gain greater than 1 and a phase path of 360 degree around the loop at that frequency. An abundance of the circuit parasitic feedback paths 112, 114 usually results in oscillations at an unwanted frequency. Sustained oscillations can completely overwhelm the input signal if the oscillations are too large in amplitude. This can lead to failure of devices.

FIG. 1C shows a typical power supply and ground configuration for system 100 including a power supply 116. Ideally, the power supply 116 would be an ideal voltage source with zero or very low output impedance. Power supplies, such as power supply 116, are usually external to the chip. However, when the power supply Vsupply is brought on the chip, the power connections on the chip are typically bonded out through bond wires to an external board that holds the power source 116. These bond wires carry a substantial amount of inductance Lsuppy and some amount of resistance Rsupply, which can form a resonance RL circuit. For example, a 1 mm bond wire about 1 mil in diameter carries 1 nH of inductance and can carry up to 500 mΩ of resistance. Although total impedance is not that high at low frequencies, the 1 nH of inductance can be the equivalent to 60–70Ω of resistance at 10 Ghz. This is also true of bond wires between the chip and ground. These bond wires can carry a substantial amount of inductance Lground and some amount of resistance Rground, which can also form a resonance RL circuit. Thus, power supplies 116 on the chip are highly non-ideal.

Again, with reference to FIG. 1C, additional parasitic loops similar to 112 and 114 are formed by the connection of the power supply 116 to the system 100. As mentioned before, because first transimpedance stage 102 is single ended, the power supply Vsupply is highly dependent on the inputs and outputs of a first gain stage 108. At higher signal frequencies (e.g., 10 GHz), with high swings at the differential outputs of gain stages 108, very low power supply Vsupply rejection or isolation is obtained even in the differential second and third, gain stages 108. Thus, even if a differential output is swung, it is not truly differential because the two outputs are at two different states so the power supply coupling to the two outputs would be different. This reduces power supply rejection. Significant amounts of signal content due to the output of op3, on3, op2, and on2, which have high swing due to amplification, can appear on (e.g., couple on) the supply voltage Vsupply because of the large bond wire impedance discussed above. This would not happen if the inductance and resistance on the bond wire were both zero because the power supply Vsupply driven by power source 116, having zero impedance, would not be disturbed at all. This signal content would feedback to the input of transimpedance stage 102 forming several parasitic loops. Then, as discussed above, if there is a large gain in the first few gain stages 108 of the amplification portion, this feedback voltage would overwhelm the input signal. Such parasitic loops can also produce significant noise or even sustained oscillations for some frequencies when the conditions of oscillations are met. These problems result in an output signal from the amplification portion that is significantly degraded because it does not resemble the input signal, which was overwhelmed.

Figure 1D:
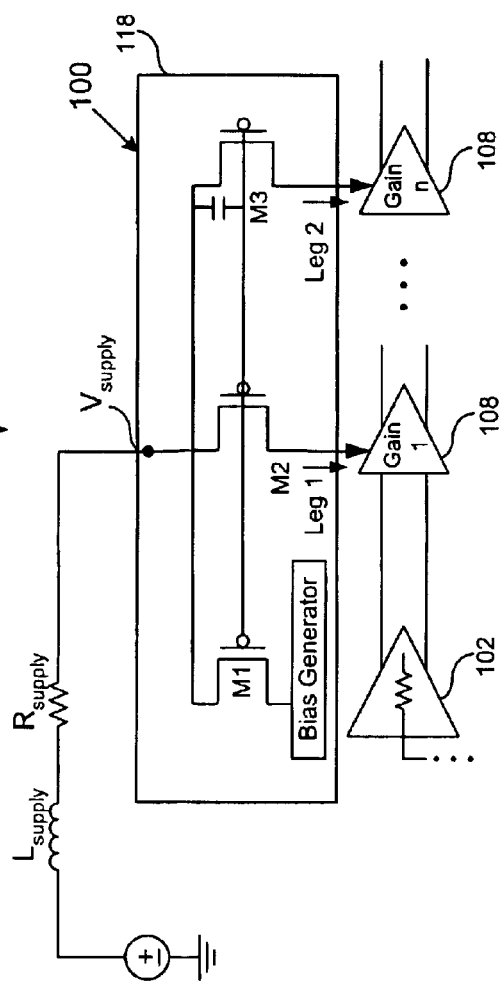
FIG. 1D is a schematic diagram of a bias current configuration for the conventional system in FIG. 1A.

FIG. 1D shows a typical bias current configuration 118 for system 100. Usually, every gain stage 108 requires a bias current to work. This bias current controls current through transistors that make up gain stages 108. Such bias currents to each gain stage 108 can be made available through a centralized bias circuit 118 shown in FIG. 1D. Each of the gain stages 108 injects a certain amount of signal dependent noise current (e.g., I1, I2, etc.) on leg 1, leg 2, etc, respectively. This is because gain stages 108 are not completely differential, as discussed above, and intrinsic impedance along bias current conductors (e.g., legs 1, 2, etc) injects some amount of signal into the legs. The signal dependent noise current injected through a third gain stage 108 and or subsequent gain stages 108 is usually large due to signal swings from proceeding gain stages.

With continuing reference to FIG. 1D, the transistors M1, M2, M3, etc. in the bias circuit 118 all have a finite output conductance (e.g., a drain to source variation), which can also effect an amplitude of the power supply Vsupply. The function of the de-coupling capacitor is to maintain a constant Vgs even when the amplitude of the power supply Vsupply changes. Also, the signal dependent current causes bias voltage supply Vsupply, which biases the transistors M1, M2, etc., to have signal dependence. This can form a feedback coupling path to the input of first gain stage 108-1. Such a feedback coupling path usually results in parasitic oscillations for some unwanted frequency when oscillation conditions are met.

Figure 2:
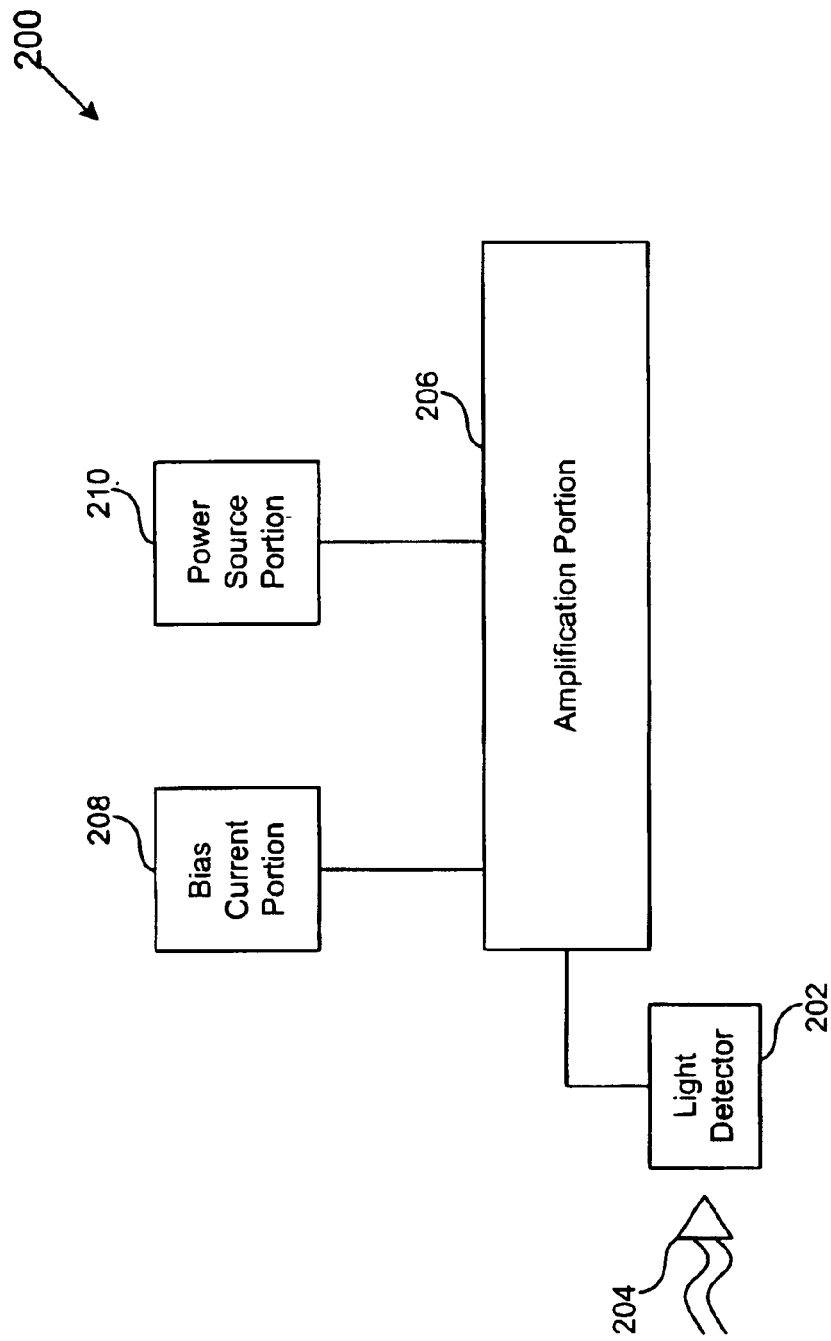
FIG. 2 is a block diagram of a system that amplifies an input signal according to embodiments of the present invention.

FIG. 2 shows a system 200 for amplifying input signals that substantially reduces parasitic feedback paths to reduce unwanted oscillations according to embodiments of the present invention. System 200 includes an input device (e.g., a light detector) 202 that detects incoming light 204 and converts it to current (e.g., an input signal). Thus, input device 202 acts as a current source. System 200 also includes an amplification portion 206 coupled to a bias current portion 208 and a power source portion 210, where their configurations leading to the reduction in parasitic feedback paths will be described in more detail below. Amplification portion 206, as is shown and discussed in relation to FIGS. 3–5, includes similar elements as system 100.

Figure 3:
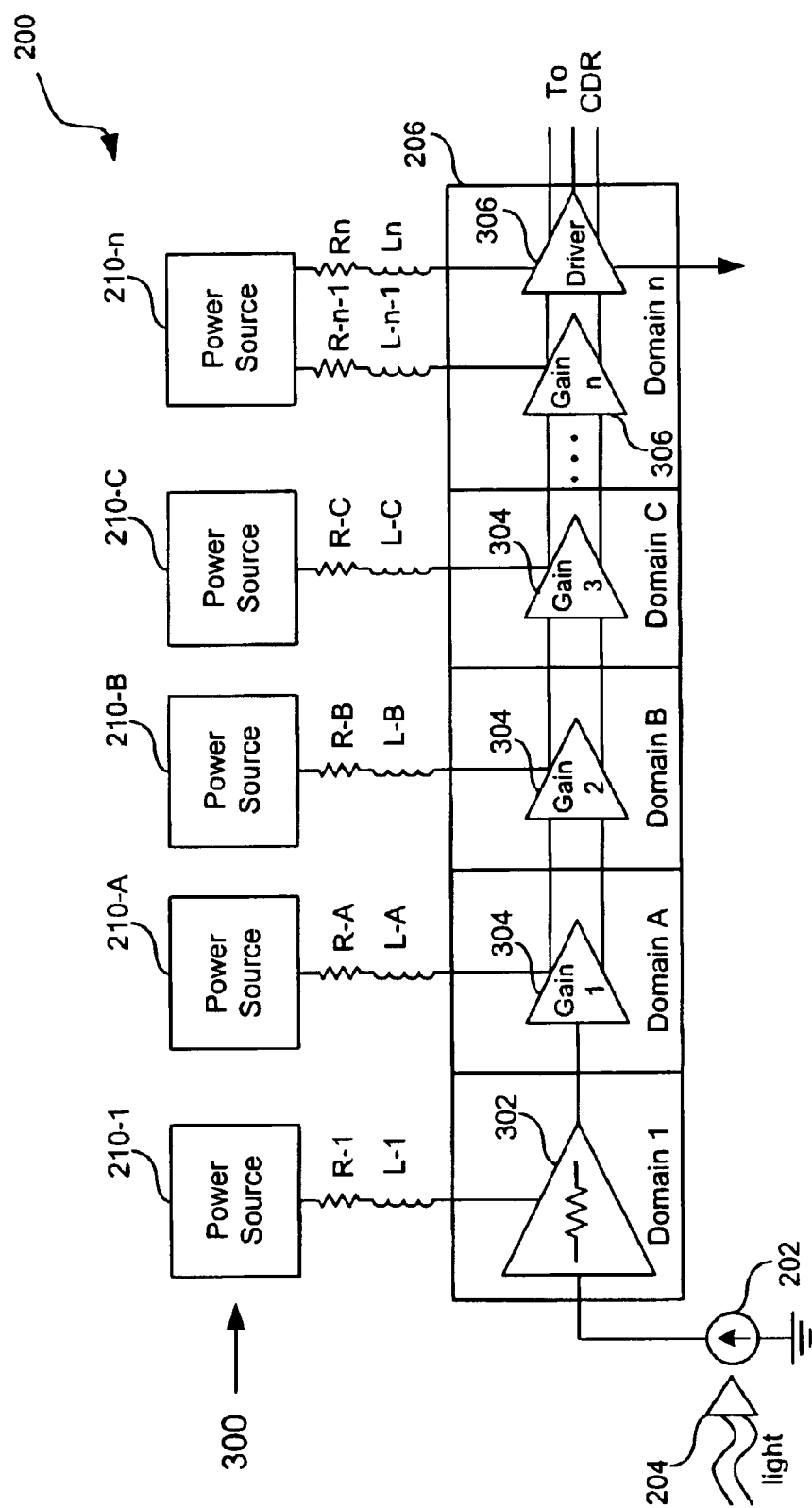
FIG. 3 is a schematic diagram of a power supply configuration for the system of FIG. 2.

FIG. 3 shows a power source configuration 300 for powering system 200 without producing unwanted parasitic feedback paths according to embodiments of the present invention. FIG. 2 also show a more detailed view of amplification portion 206, which includes a transimpedance stage 302, gain stages 304, and a driver stage 306. In one embodiment, amplifier portion 206 can have transimpedance stage 302, five gain stages 304, and drive stage 306. It is to be appreciated, more gain stages 304 can be used based on different amplifier requirements. A first group of amplifiers or stages in amplification portion 206 are coupled to individual (e.g., dedicated) power sources 210 and individual (e.g., dedicated) ground connections. A second group of stages in amplification portion 206 is coupled to a single power supply 210 and ground connection. As discussed above, between each power supply 210 and stage 302, 304, and/or 306 are a bond wire resistance R and inductance L. This is shown in subsequent figures as well.

In some embodiments, the first group can include transimpedance gain stage 302 and the first two gain stages 304. In other embodiments, the first group can be transimpedance stage 302 and the first three gain stages 304. In still other embodiments, the first group can be defined based on specifications of a user, i.e., based on the amount of gain desired to be implemented in each gain stage 304. However, gain/bandwidth product for each stage 304 is preferably kept relatively high, so only a limited gain can be efficiently introduced at each stage 304. Thus, it is typically more desirable to have an optimum gain/bandwidth product and more stages 304. The second group includes whatever stages 304 that are not in the first group and driving stage 306.

The first group includes the first few stages 302 and 304 because subsequent or downstream stages 304 produce a signal that is more and more differential. Thus, reducing or eliminating feedback coupling paths is not as critical for the higher numbered stages 304, as is discussed in more detail below.

Amplification of the input signal remains relatively small through the first few stages 302 and 304. In contrast, beyond the first few gain stages 304 amplification of the input signal is quite large, such that even with feedback coupling the amplified input signal will not be drowned out by oscillations caused by the parasitic feedback paths.

Further, the reason only the first, transimpedance stage 302 and the first few gain stages 304 need their own power supply 210 is because power supply rejection (e.g., a measure of how well a A.C signal (or oscillation) on the power supply is rejected at the outputs of that circuit) in these stages is especially poor. As the input signal proceeds down the chain of gain stage 304, it becomes less and less essential to have individual power supplies 210. Where the input signal becomes differential, power supply Vsupply rejection improves, and small signal coupling does not affect the layer amplitude signal. In essence, there are Domains (e.g., Domains 1, A, B, C, etc. . . . ) corresponding to each power supply 210, transimpedance stage 302, gain stage 304 in the first group, and the rest of the second groups gain stages 304 and driver stage 306. Parasitic paths are substantially reduced because there is no communication between these Domains except for desired signals.

Figure 4:
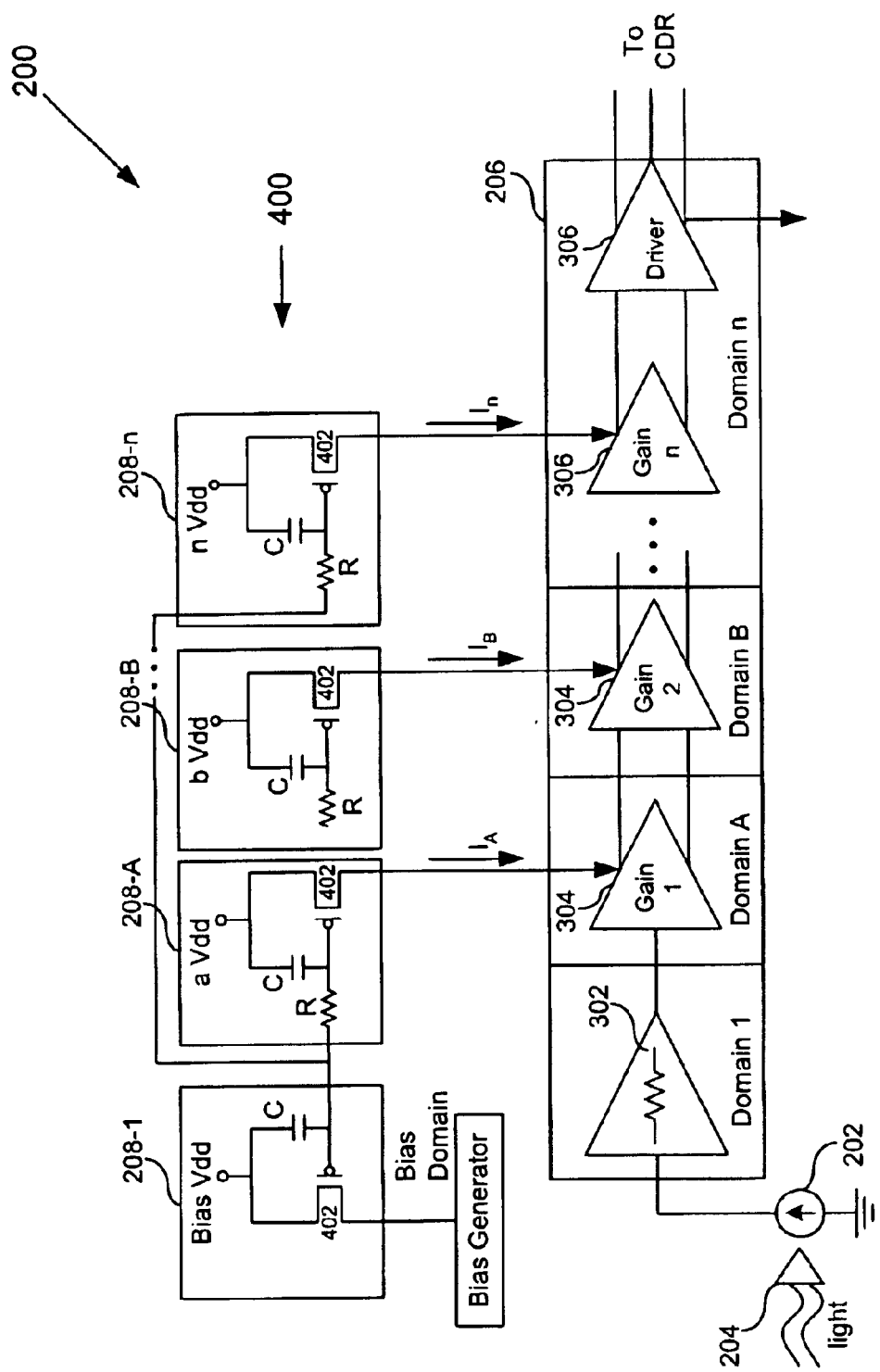
FIG. 4 is a schematic diagram of a bias current configuration for the system of FIG. 2.

FIG. 4 shows a bias current device configuration 400 for biasing elements in system 100 according to embodiments of the present invention. Each Domain (e.g., Domain A, Domain B, etc.) is biased using an individual or dedicated bias current device 208 that includes a dedicated transistor (e.g., a PMOS transistor or bipolar transistor) 402 coupled to that domain's supply voltage (e.g., voltage aVdd, voltage bvdd, etc.) to produce respective bias currents (e.g., Ia, Ib, etc). Each bias current device 208 routes it's bias current only to a corresponding stage 304. High frequency coupling from one Domain to either the Bias Domain or to other Domains is essentially eliminated by the use of a local low pass filter formed by an RC network in each bias current device 208. The low pass filters have pole frequencies of $\frac{1}{2}\pi RC$, which are much smaller than the possible oscillation frequencies. Thus, bias current device configuration 400 reduces unwanted oscillation through the use of individual bias current devices with individual voltage supplies, such that the Domains are isolate from each other.

Figure 5:
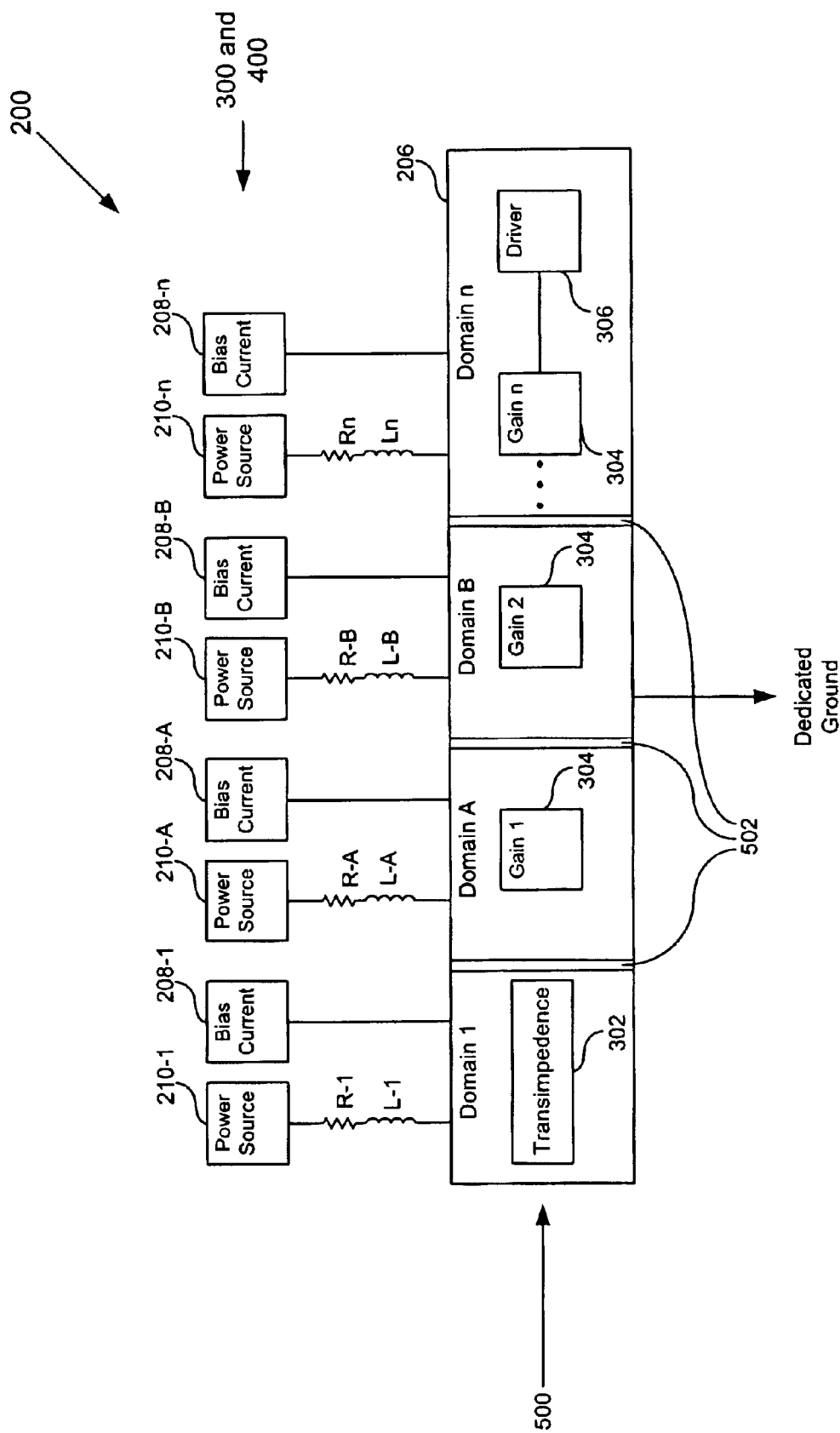
FIG. 5 is a block diagram of a configuration to virtually eliminate parasitic feedback paths in the system of FIG. 2.
Figure 6:
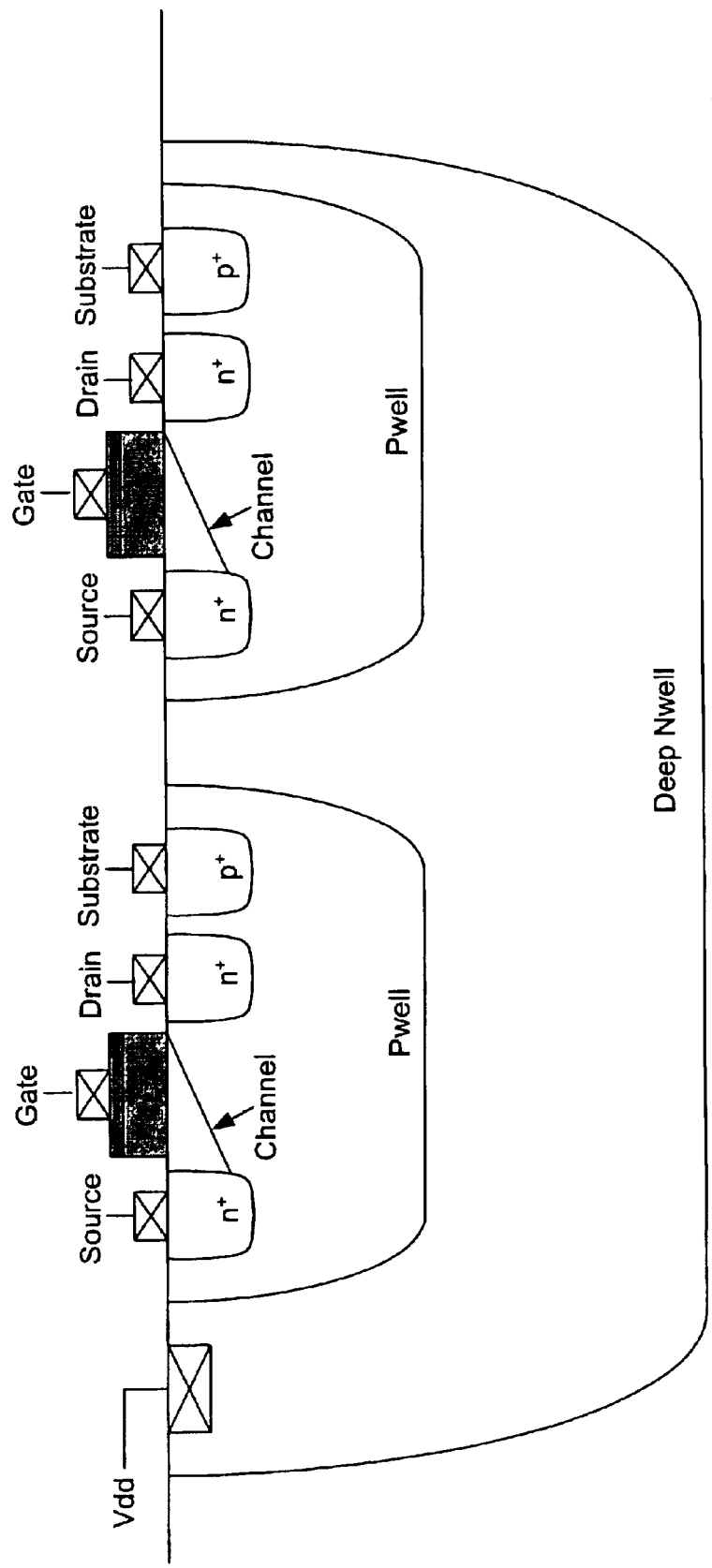
FIG. 6 shows a "twin well (tub)" process technology producing a dedicated Pwell in a deep Nwell.

FIG. 5 shows a configuration 500 to substantially reduce parasitic feedback paths in system 200 according to embodiments of the present invention. As is known in the art, a "twin well (tub)" process technology produces a dedicated Pwell in a deep Nwell (see FIG. 6). In one embodiment, NMOS transistors can be exclusively used throughout an entire design of first, transimpedance stage 302, gain stages 304, and driver stage 306. The NMOS transistors of each Domain are positioned in the dedicated Pwells located in the deep Nwells. The NMOS transistors are tied to the respective Domain power source 210. Also, no active nodes are coupled to an entire substrate (not shown) that includes the Domains. The substrate is tied to ground through external, dedicated pins (not shown). Each Domain layout can include a insulation ring 502 isolating one Domain from all the other Domains. Therefore, in contrast to conventional systems as described above, the substrate is only coupled to external, dedicated pins and nothing else. This essentially eliminates parasitic feed back paths 112, 114 (e.g., substrate coupling) in the conventional system 100 from any element in one Domain to any element in all the other Domains in system 200.

Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A system comprising:
a power source portion including a plurality of power sources;
a bias current portion including a plurality of bias current devices coupled to respective individual ones of the plurality of power sources; and
an amplification portion including a plurality of amplifiers, a first group of said plurality of amplifiers being coupled to said power source portion and said bias current portion such that parasitic paths from outputs of said plurality of amplifiers to inputs of said plurality of amplifiers are substantially eliminated to substantially eliminate oscillations in said amplification portion.

2. The system of claim 1, wherein said first group comprises a transimpedance amplifier, a first gain stage, and a second gain stage.

3. The system of claim 2, wherein:
said transimpedance amplifier is coupled to a first one of said plurality of power sources;
said first gain stage is coupled to a second one of said plurality of power sources; and
said second gain stage is coupled to a third one of said plurality of power sources.

4. The system of claim 2, wherein:
said transimpedance amplifier is coupled to a first one of said plurality of bias current devices;
said first gain stage is coupled to a second one of said plurality of bias current devices; and
said second gain stage is coupled to a third one of said plurality of bias current devices.

5. The system of claim 2, wherein:
said transimpedance amplifier is coupled to a first one of said plurality of power sources and a first one of said plurality of bias current devices that is also coupled to the first one of said plurality of power sources;
said first gain stage is coupled to a second one of said plurality of power sources and a second one of said bias current devices that is also coupled to the second one of said plurality of power sources; and
said second gain stage is coupled to a third one of said plurality of power sources and a third one of said bias current devices that is also coupled to the third one of said plurality of power sources.

6. The system of claim 1, wherein said first group comprises a transimpedance amplifier and gain stages.

7. The system of claim 6, wherein:
said transimpedance amplifier is coupled to one of said plurality of power sources; and
individual ones of said gain stages are coupled to corresponding individual ones of said plurality of power sources.

8. The system of claim 6, wherein:
said transimpedance amplifier is coupled to one of said plurality of bias current devices; and
individual ones of said gain stages are coupled to corresponding individual ones of said plurality of bias current devices.

9. The system of claim 6, wherein:
said transimpedance amplifier is coupled to one of said plurality of power sources and one of said plurality of bias current devices; and
individual ones of said gain stages are coupled to corresponding individual ones of said plurality of power sources and individual ones of said plurality of bias current devices.

10. The system of claim 1, wherein said first group comprises a transimpedance stage and first and second gain stages.

11. The system of claim 1, wherein said first group comprises a transimpedance stage and first through third gain stages.

12. The system of claim 1, wherein said first group comprises a transimpedance stage and first through fourth gain stages.

13. The system of claim 1, wherein each amplifier in said first group comprises NMOS transistors in dedicated P-wells, wherein said P-wells are located in deep N-wells, and wherein said N-wells are coupled to corresponding ones of said plurality of power sources.

14. The system of claim 1, wherein respective ones of said plurality of amplifiers in said first group are coupled to respective ones of said plurality of power sources.

15. The system of claim 1, wherein each said amplifier in the first group is isolated from all other ones of the amplifiers through a dedicated guard ring coupled to an external dedicated ground pin that is electrically isolated from all other active nodes in the system.

16. The system of claim 1, further comprising a second group of said plurality of amplifiers that is coupled to a single one of said plurality of power sources.

17. The system of claim 16, further comprising a driver device coupled to said second group.

18. The system of claim 1, further comprising a second group of said plurality of amplifiers that is coupled to a single one of said plurality of current bias devices.

19. The system of claim 1, further comprising a driver device coupled to said second group.

20. The system of claim 1, further comprising:
   a second group of said plurality of amplifiers coupled to a single one of said plurality of power sources and a single one of said plurality of bias current devices; and
   a driver device coupled to said second group.

21. The system of claim 1, wherein each of the plurality of bias current devices is connected to other ones of the plurality of bias current devices coupled through decoupling RC circuits.

22. A system for reducing unwanted oscillations in a multiple gigabit per second, high gain amplifier portion, the system comprising:
   power sources coupled to the amplifier portion;
   bias current devices coupled to the amplifier portion; and
   the amplifier portion including,
      a transimpedance amplifier,
      a plurality of gain amplifiers, one of the gain amplifiers being coupled at an input to an output of said transimpedance amplifier, a first group of said plurality of gain amplifiers being coupled to said power sources and said bias current devices, such that parasitic paths from outputs of said plurality of gain amplifiers to inputs of said plurality of gain amplifiers are substantially eliminated to substantially eliminate oscillations in said amplification portion, and
      a driving device coupled at an input to an output of different one of said gain amplifiers than said transimpedance amplifier is coupled.

23. The system of claim 22, wherein the amplifier portion further comprises:
   a first group of said gain amplifiers, wherein each said gain amplifier in said first group of said gain amplifiers is coupled to a corresponding one of said power sources; and
   wherein said transimpedance amplifier is coupled to one of said power sources.

24. The system of claim 23, wherein the amplifier portion further comprises a second set of said gain amplifiers that is coupled to a single one of said power sources.

25. The system of claim 22, wherein the amplification portion further comprises:
   a first group of said gain amplifiers, wherein each one of a first group of said gain amplifiers is coupled to a corresponding one of said bias current devices; and
   wherein the transimpedance amplifier is coupled to one of said bias current devices.

26. The system of claim 25, wherein the amplification portion further comprises a second set of said gain amplifiers coupled to a single one of said bias current devices.

27. The system of claim 22, wherein the amplification portion further comprises:
   a first group of said gain amplifiers, wherein each one of a first group of said gain amplifiers is coupled to a corresponding one of said power source and a corresponding one of said bias current devices; and
   wherein the transimpedance amplifier is coupled to one of said power sources and one of said bias current devices.

28. The system of claim 27, wherein the amplification portion further comprises a second set of said gain amplifiers that is coupled to a single one of said power sources and a single one of said bias current devices.

29. The system of claim 22, wherein each said gain amplifier in the first group is isolated from all other ones of the gain amplifiers through a dedicated guard ring coupled to an external dedicated ground pin that is electrically isolated from all other active nodes in the system.

30. The system of claim 22, wherein the amplifier portion further comprises a first group of said gain amplifiers that are arranged as electrically isolated sets of one of said power sources coupled to one of said gain amplifiers.

* * * * *